(12) United States Patent
Nakagawa

(10) Patent No.: US 11,398,503 B2
(45) Date of Patent: Jul. 26, 2022

(54) DISPLAY DEVICE

(71) Applicant: Panasonic Liquid Crystal Display Co., Ltd., Hyogo (JP)

(72) Inventor: Teruhisa Nakagawa, Hyogo (JP)

(73) Assignee: PANASONIC LIQUID CRYSTAL DISPLAY CO., LTD., Hyogo (JP)

( * ) Notice: Subject to any disclaimer, the term of this patent is extended or adjusted under 35 U.S.C. 154(b) by 198 days.

(21) Appl. No.: 16/774,792

(22) Filed: Jan. 28, 2020

(65) Prior Publication Data

US 2020/0312884 A1  Oct. 1, 2020

(30) Foreign Application Priority Data

Mar. 28, 2019  (JP) .............................. JP2019-063283

(51) Int. Cl.
*G02F 1/1362* (2006.01)
*H01L 27/12* (2006.01)
*G09G 3/36* (2006.01)

(52) U.S. Cl.
CPC ...... *H01L 27/124* (2013.01); *G02F 1/136286* (2013.01); *G02F 2201/123* (2013.01); *G09G 3/3677* (2013.01); *G09G 3/3688* (2013.01); *G09G 2300/0426* (2013.01); *G09G 2310/0202* (2013.01); *G09G 2320/0233* (2013.01)

(58) Field of Classification Search
CPC .......... G02F 1/136286; G02F 1/13629; G02F 1/136263; G02F 1/136272; G02F 1/136259; G02F 1/134309; G09G 2320/0233; G09G 2310/0202; G09G 2310/0262; H01L 27/3276
See application file for complete search history.

(56) References Cited

U.S. PATENT DOCUMENTS

| | | | |
|---|---|---|---|
| 2012/0026206 A1* | 2/2012 | Moon .................. | G09G 3/3614 345/690 |
| 2013/0321251 A1* | 12/2013 | Kang ................ | G02F 1/136286 345/87 |
| 2017/0148404 A1* | 5/2017 | Xing .................... | G09G 3/3688 |
| 2020/0064663 A1* | 2/2020 | Ra ....................... | H01L 27/1255 |

FOREIGN PATENT DOCUMENTS

JP  2017-97053  6/2017

* cited by examiner

*Primary Examiner* — Mariam Qureshi
(74) *Attorney, Agent, or Firm* — Wenderoth, Lind & Ponack, L.L.P.

(57) ABSTRACT

A display device, comprising: a first pixel row including a first pixel electrode and a second pixel electrode that are arranged in a first direction; a second pixel row; a third pixel row; a first source line and a second source line that extend in a second direction between the first pixel electrode and the second pixel electrode; a first gate line that extends in the first direction between the first pixel row and the second pixel row; a second gate line that extends in the first direction between the second pixel row and the third pixel row; a first end connection wiring that connects the first gate line to the second gate line at an end portion of the second pixel row; and one or more first cross connection wirings that transverse the second pixel row and connect the first gate line to the second gate line.

13 Claims, 6 Drawing Sheets

DISPLAY DEVICE

CROSS-REFERENCE TO RELATED APPLICATION

This application claims priority from Japanese application JP 2019-063283, filed Mar. 28, 2019. This Japanese application is incorporated herein by reference.

BACKGROUND

Field of the Invention

The present invention relates to a display device.

Background Art

A liquid crystal display device described in JP-A-2017-097053 includes a plurality of gate lines extending in a first direction and a plurality of source lines extending in a second direction that crosses the first direction. A pixel electrode is disposed in a region surrounded by two adjacent gate lines and two adjacent source lines, and a plurality of pixel electrodes are arranged in the first direction and the second direction. Each of the pixel electrodes is electrically connected to a gate line and a source line.

SUMMARY OF THE INVENTION

One problem with the configuration disclosed in JP-A-2017-097053 is occurrence of dark lines. Specifically, with the conventional configuration described above, when there is a break in a portion of the gate line, gate signals are not supplied to the plurality of pixel electrodes connected to that gate line, dark lines occur, and display failures occur.

In light of the problem described above, an object of the present disclosure is to suppress the occurrence of display failures.

A display device according to the present disclosure includes a first pixel row including a first pixel electrode and a second pixel electrode that are arranged in a first direction; a second pixel row including a third pixel electrode and a fourth pixel electrode that are arranged in the first direction, the second pixel row being adjacent to the first pixel row in a second direction that crosses the first direction; a third pixel row including a fifth pixel electrode and a sixth pixel electrode that are arranged in the first direction, the third pixel row being adjacent to the second pixel row in the second direction; a first source line and a second source line that extend in the second direction between the first pixel electrode and the second pixel electrode, between the third pixel electrode and the fourth pixel electrode, and between the fifth pixel electrode and the sixth pixel electrode; a first gate line that extends in the first direction between the first pixel row and the second pixel row; a second gate line that extends in the first direction between the second pixel row and the third pixel row; a first end connection wiring that connects the first gate line to the second gate line at an end portion of the second pixel row; and one or more first cross connection wirings that transverse the second pixel row and connect the first gate line to the second gate line.

With the display device according to the present disclosure, it is possible to suppress the occurrence of display failures.

DETAILED DESCRIPTION OF THE INVENTION

Next, a first exemplary embodiment of the present disclosure will be described while referencing the drawings. In the following, an example is described in which a liquid crystal display device is implemented as a display device 100, but the display device according to the present invention is not limited to a liquid crystal display device and, may be implemented as an organic electroluminescence (EL) display device or the like, for example.

First Exemplary Embodiment

Figure 1:
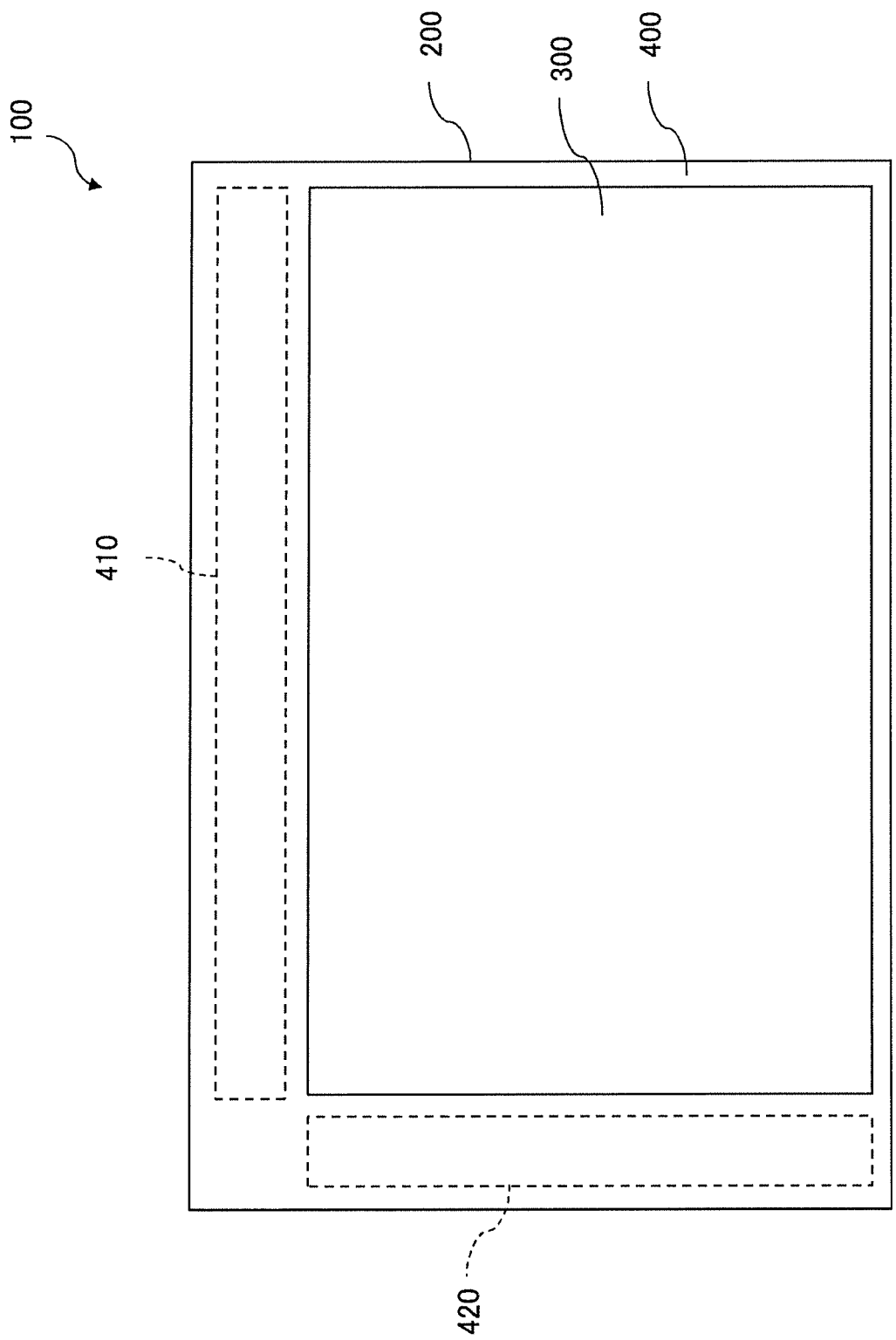
FIG. 1 is a plan view illustrating a schematic configuration of a display device according to a first exemplary embodiment.

FIG. 1 is a plan view illustrating a schematic configuration of the display device 100 according to a first exemplary embodiment. The display device 100 mainly includes a display panel 200 and a back light (not illustrated in the drawings) disposed on the back surface side of the display panel 200. Roughly divided by region, the display panel 200 includes a display region 300 in which images are displayed, and a frame region 400 positioned on the outer periphery of the display region 300.

A source driver 410 that supplies source signals to a plurality of source lines is disposed on one side of the frame region 400, and a gate driver 420 that supplies gate signals to a plurality of gate lines is disposed on another side of the frame region 400. Note that, in the present embodiment, an example of a configuration is described in which the source driver 410 and the gate driver 420 are disposed on two sides that extend in directions that cross each other. However, a configuration is possible in which the side on which the source driver 410 is disposed and the side on which the gate driver 420 is disposed face each other. In addition, a configuration is possible in which the source driver 410 and the gate driver 420 are disposed on the same side.

Figure 2:
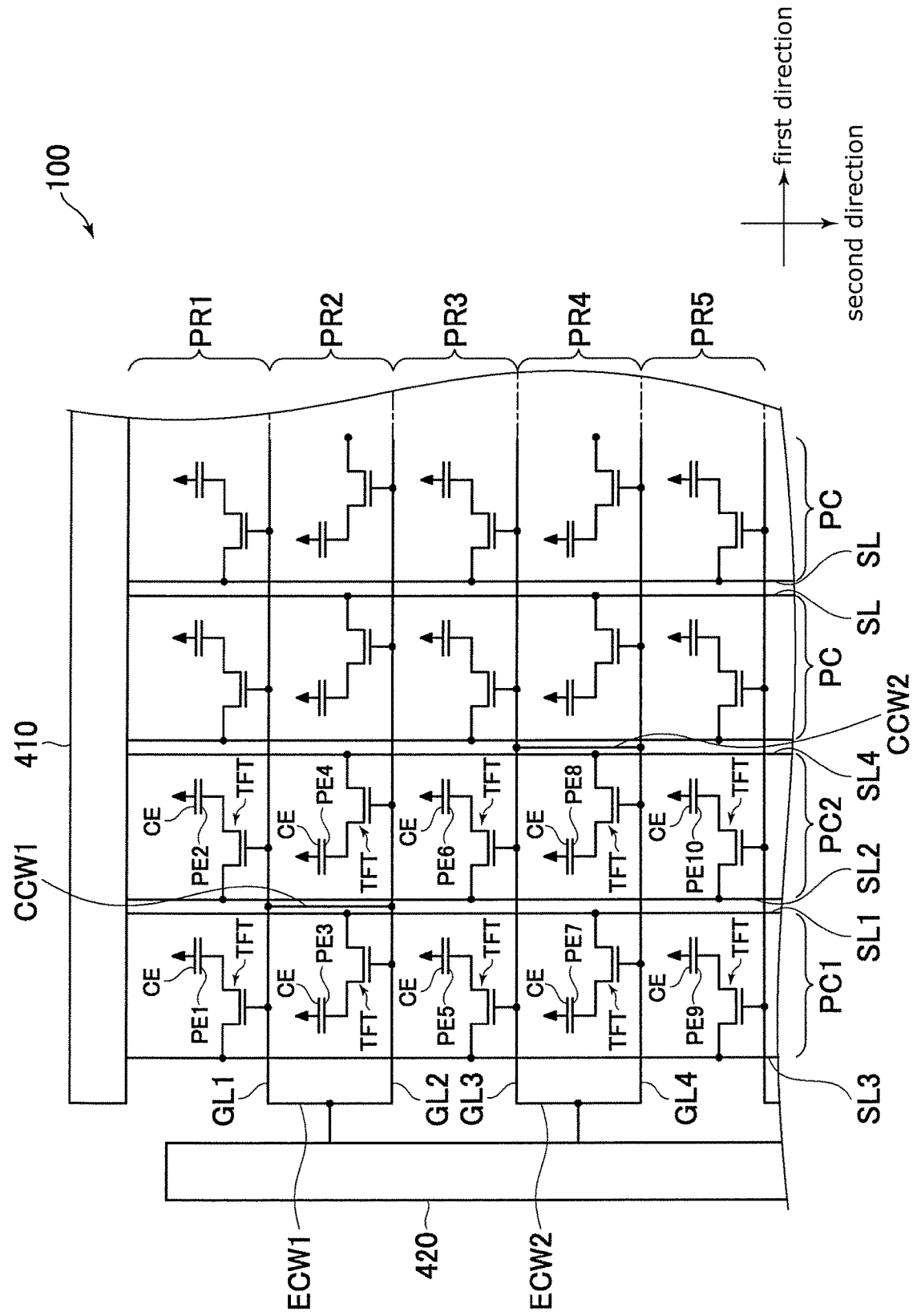
FIG. 2 is a circuit diagram illustrating a schematic configuration of a pixel region of a display panel according to a first exemplary embodiment.

FIG. 2 is a circuit diagram illustrating a schematic configuration of a pixel region of the display panel 200 according to the present embodiment.

As illustrated in FIG. 2, the display device 100 includes a plurality of gate lines GL (GL1, GL2, GL3, GL4, and the like), and the gate driver 420 that supplies gate signals to each of the gate lines GL. Each of the gate lines GL is connected to the gate driver 420 and extends in a first direction. Specifically, the plurality of gate lines GL are disposed at substantially equal intervals in a second direction that crosses the first direction, and extend in the first direction so as to traverse between a plurality of pixels.

As illustrated in FIG. 2, the display device 100 includes a plurality of source lines SL (SL1, SL2, SL3, SL4, and the like), and the source driver 410 that supplies source signals to each of the source lines SL. Each of the source lines SL is connected to the source driver 410 and extends in the second direction so as to traverse between a plurality of pixels. Specifically, two of the source lines SL extend in the second direction between the pixels.

A plurality of pixel regions partitioned by the plurality of gate lines GL and the plurality of source lines SL are disposed in a matrix manner in the display region 300 of the display panel 200. As illustrated in FIG. 2, the display panel 200 includes a plurality of pixel electrodes PE (PE1, PE2, PE3, PE4, PE5, PE6, PE7, PE8, PE9, PE10, and the like) formed in the plurality of pixel regions, common electrodes CE that correspond to the plurality of pixel electrodes PE, and a plurality of thin film transistors TFT formed near the intersection of each gate line GL and each source line SL. Common potential is supplied to the common electrodes CE.

As illustrated in FIG. 2, a group of the plurality of pixel electrodes PE arranged in the first direction forms a pixel row PR (PR1, PR2, PR3, PR4, and the like). In the present embodiment, a pixel row including the first pixel electrode PE1 and the second pixel electrode PE2 that are arranged in the first direction is defined as a first pixel row PR1, a pixel row including the third pixel electrode PE3 and the fourth pixel electrode PE4 that are arranged in the first direction is defined as a second pixel row PR2, a pixel row including the fifth pixel electrode PE5 and the sixth pixel electrode PE6 that are arranged in the first direction is defined as a third pixel row PR3, a pixel row including the seventh pixel electrode PE7 and the eighth pixel electrode PE8 that are arranged in the first direction is defined as a fourth pixel row PR4, and a pixel row including the ninth pixel electrode PE9 and the tenth pixel electrode PE10 that are arranged in the first direction is defined as a fifth pixel row PR5. The first pixel row PR1, the second pixel row PR2, the third pixel row PR3, the fourth pixel row PR4, and the fifth pixel row PR5 are disposed in this order in the second direction. As such, the second pixel row PR2 is adjacent to the first pixel row PR1 in the second direction, the third pixel row PR3 is adjacent to the second pixel row PR2 in the second direction, the fourth pixel row PR4 is adjacent to the third pixel row PR3 in the second direction, and the fifth pixel row PR5 is adjacent to the fourth pixel row PR4 in the second direction.

As illustrated in FIG. 2, a group of the plurality of pixel electrodes PE arranged in the second direction forms a pixel column PC (PC1, PC2, and the like). In the present embodiment, a pixel column including the first pixel electrode PE1, the third pixel electrode PE3, the fifth pixel electrode PE5, the seventh pixel electrode PE7, and the ninth pixel electrode PE9 arranged in the second direction is defined as a first pixel column PC1, and a pixel column including the second pixel electrode PE2, the fourth pixel electrode PE4, the sixth pixel electrode PE6, the eighth pixel electrode PE8, and the tenth pixel electrode PE10 arranged in the second direction is defined as a second pixel column PC2. The first pixel column PC1 and the second pixel column PC2 are adjacent in the first direction.

The first source line SL1 and the second source line SL2 extend in the second direction between the first pixel column PC1 and the second pixel column PC2. Specifically, the first source line SL1 and the second source line SL2 extend in the second direction between the first pixel electrode PE1 and the second pixel electrode PE2, between the third pixel electrode PE3 and the fourth pixel electrode PE4, between the fifth pixel electrode PE5 and the sixth pixel electrode PE6, between the seventh pixel electrode PE7 and the eighth pixel electrode PE8, and between the ninth pixel electrode PE9 and the tenth pixel electrode PE10. The first source line SL1 is disposed at a position closer to the first pixel column PC1 than the second source line SL2, and the second source line SL2 is disposed at a position closer to the second pixel column PC2 than the first source line SL1. Specifically, the first source line SL1 is disposed at a position closer to the first pixel electrode PE1 than the second source line SL2, and the second source line SL2 is disposed at a position closer to the second pixel electrode PE2 than the first source line SL1.

The third pixel electrode PE3 and the seventh pixel electrode PE7 are electrically connected to the first source line SL1 via the thin film transistor TFT. The second pixel electrode PE2, the sixth pixel electrode PE6, and the tenth pixel electrode PE10 are electrically connected to the second source line SL2 via the thin film transistor TFT.

The third source line SL3 extending in the second direction is disposed on the left side of the first pixel column PC1, and the third source line SL3 is disposed so that the third source line SL3 and the first source line SL1 sandwich the first pixel column PC1. The first pixel electrode PE1, the fifth pixel electrode PE5, and the ninth pixel electrode PE9 are electrically connected to the third source line SL3 via the thin film transistor TFT.

The fourth source line SL4 extending in the second direction is disposed on the right side of the second pixel column PC2, and the fourth source line SL4 is disposed so that the fourth source line SL4 and the second source line SL2 sandwich the second pixel column PC2. The fourth pixel electrode PE4 and the eighth pixel electrode PE8 are electrically connected to the fourth source line SL4 via the thin film transistor TFT.

The first gate line GL1 extends in the first direction between the first pixel row PR1 and the second pixel row PR2, that is, between the first pixel electrode PE1 and the third pixel electrode PE3, and between the second pixel electrode PE2 and the fourth pixel electrode PE4. The second gate line GL2 extends in the first direction between the second pixel row PR2 and the third pixel row PR3, that is, between the third pixel electrode PE3 and the fifth pixel electrode PE5, and between the fourth pixel electrode PE4 and the sixth pixel electrode PE6. The third gate line GL3 extends in the first direction between the third pixel row PR3 and the fourth pixel row PR4, that is, between the fifth pixel electrode PE5 and the seventh pixel electrode PE7, and between the sixth pixel electrode PE6 and the eighth pixel electrode PE8. The fourth gate line GL4 extends in the first direction between the fourth pixel row PR4 and the fifth pixel row PR5, that is, between the seventh pixel electrode PE7 and the ninth pixel electrode PE9, and between the eighth pixel electrode PE8 and the tenth pixel electrode PE10.

The first pixel electrode PE1 and the second pixel electrode PE2 are electrically connected to the first gate line GL1 via the thin film transistor TFT. The third pixel electrode PE3 and the fourth pixel electrode PE4 are electrically connected to the second gate line GL2 via the thin film transistor TFT. The fifth pixel electrode PE5 and the sixth pixel electrode PE6 are electrically connected to the third gate line GL3 via the thin film transistor TFT. The seventh pixel electrode PE7 and the eighth pixel electrode PE8 are electrically connected to the fourth gate line GL4 via the thin film transistor TFT.

At the end of the second pixel row PR2, the first gate line GL1 and the second gate line GL2 are connected to each other by a first end connection wiring ECW1, and a common gate signal is supplied to the gate lines GL1 and GL2 via the first end connection wiring ECW1 from the gate driver 420. Likewise, at the end of the fourth pixel row PR4, the third gate line GL3 and the fourth gate line GL4 are connected by a second end connection wiring ECW2, and a common gate signal is supplied to the gate lines GL3 and GL4 via the second end connection wiring ECW2 from the gate driver 420.

Due to this configuration, it is possible to reproduce the desired brightness at each pixel, even in high-definition and large-screen display devices. Typically, in high-definition display devices, the write time for supplying a gate signal to one gate line GL is short. That is, the pulse width of the gate signal is short. In addition, in large-screen display devices, sufficient writing may not be possible due to the delay resulting from increased gate resistance and capacitance. A solution to these problems is to adopt a configuration, such as that described above, in which a common gate signal is input into two of the gate lines GL. With such a configuration, it is possible to double the write time and double the pulse width of the gate signal. As a result, it is possible to reproduce the desired brightness at each pixel, even in high-definition and large-screen display devices.

In the present embodiment, in the configuration described above, the display device 100 further includes one or more first cross connection wirings CCW1 that traverse the second pixel row PR2 and connect the first gate line GL1 and the second gate line GL2 to each other. Due to this configuration, it is possible to suppress the occurrence of dark lines. For example, even when a break occurs in the first gate line GL1 or the second gate line GL2, since the one or more first cross connection wirings CCW1 are provided that connect the first gate line GL1 and the second gate line GL2 to each other, it is possible to supply gate signals via the first cross connection wirings CCW1 and, as a result, suppress the occurrence of dark lines and suppress the occurrence of display failures.

Likewise, in the present embodiment, the display device 100 further includes one or more second cross connection wirings CCW2 that traverse the fourth pixel row PR4 and connect the third gate line GL3 and the fourth gate line GL4 to each other. Due to this configuration, for example, even when a break occurs in the third gate line GL3 or the fourth gate line GL4, it is possible to supply gate signals via the one or more second cross connection wirings CCW2 that connect the third gate line GL3 and the fourth gate line GL4 to each other and, as a result, suppress the occurrence of dark lines.

Figure 3:
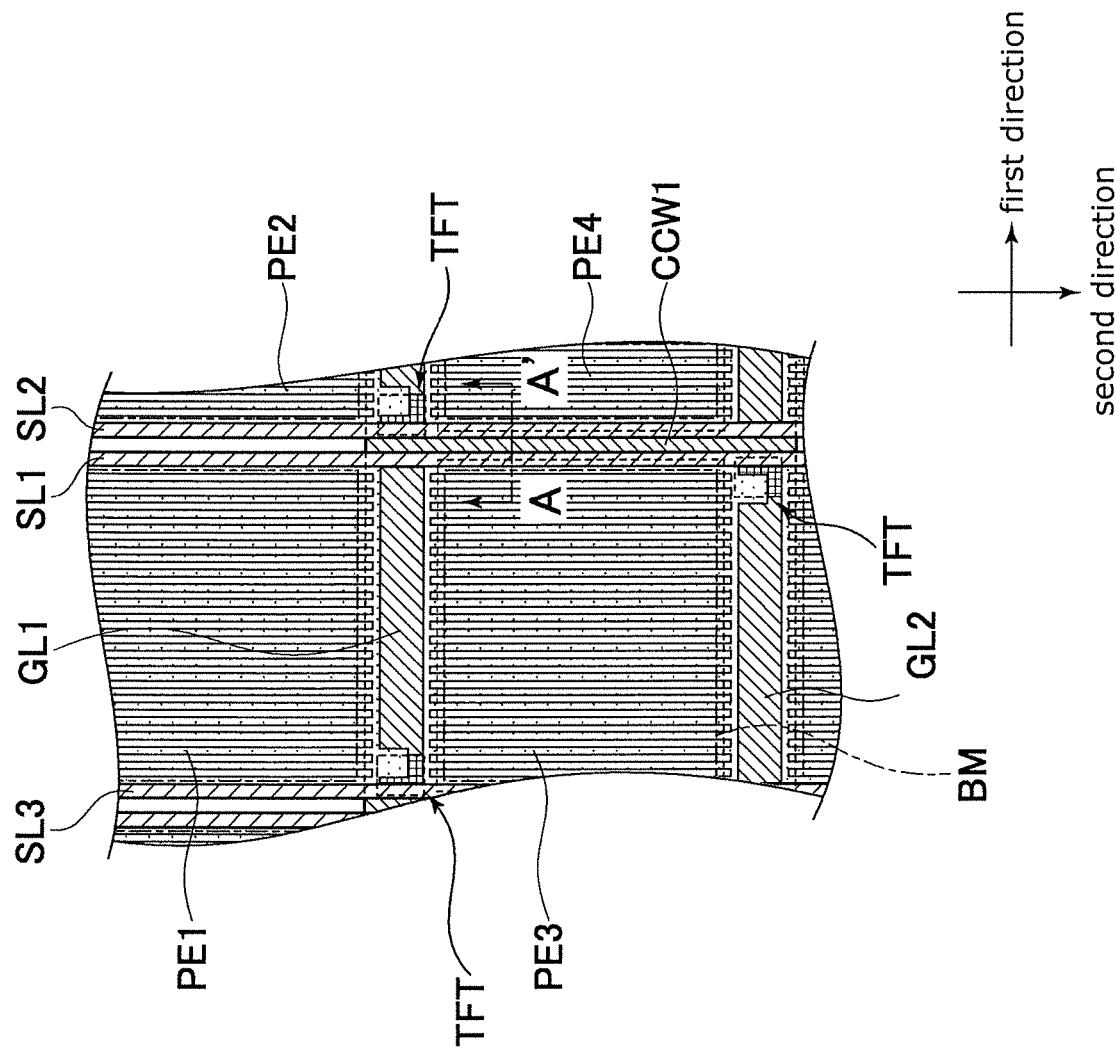
FIG. 3 is a schematic plan view illustrating the arrangement relationship between pixel electrodes and a cross connection wiring according to a first exemplary embodiment.

FIG. 3 is a schematic plan view illustrating the arrangement relationship between the pixel electrodes and the cross connection wiring according to the present embodiment. As illustrated in FIG. 3, the first gate line GL1 is disposed between the first pixel electrode PE1 and the third pixel electrode PE3 so as to extend in the first direction. The first gate line GL1 and the first pixel electrode PE1 are electrically connected to each other via the thin film transistor TFT. The third pixel electrode PE3 and the second gate line GL2 are electrically connected to each other via the thin film transistor TFT. The first source line SL1 and the second source line SL2 are disposed between the third pixel electrode PE3 and the fourth pixel electrode PE4 so as to extend in the second direction. Moreover, in the example illustrated in FIG. 3, at least a portion of the first cross connection wiring CCW1 is overlapped between the first source line SL1 and the second source line SL2 when viewed from above, that is in plan view.

In the example illustrated in FIG. 3, a black matrix BM is disposed so as to be overlapped between two of the pixel electrodes PE that are adjacent in the first direction and between two of the pixel electrodes PE that are adjacent in the second direction when viewed from above.

Figure 4:
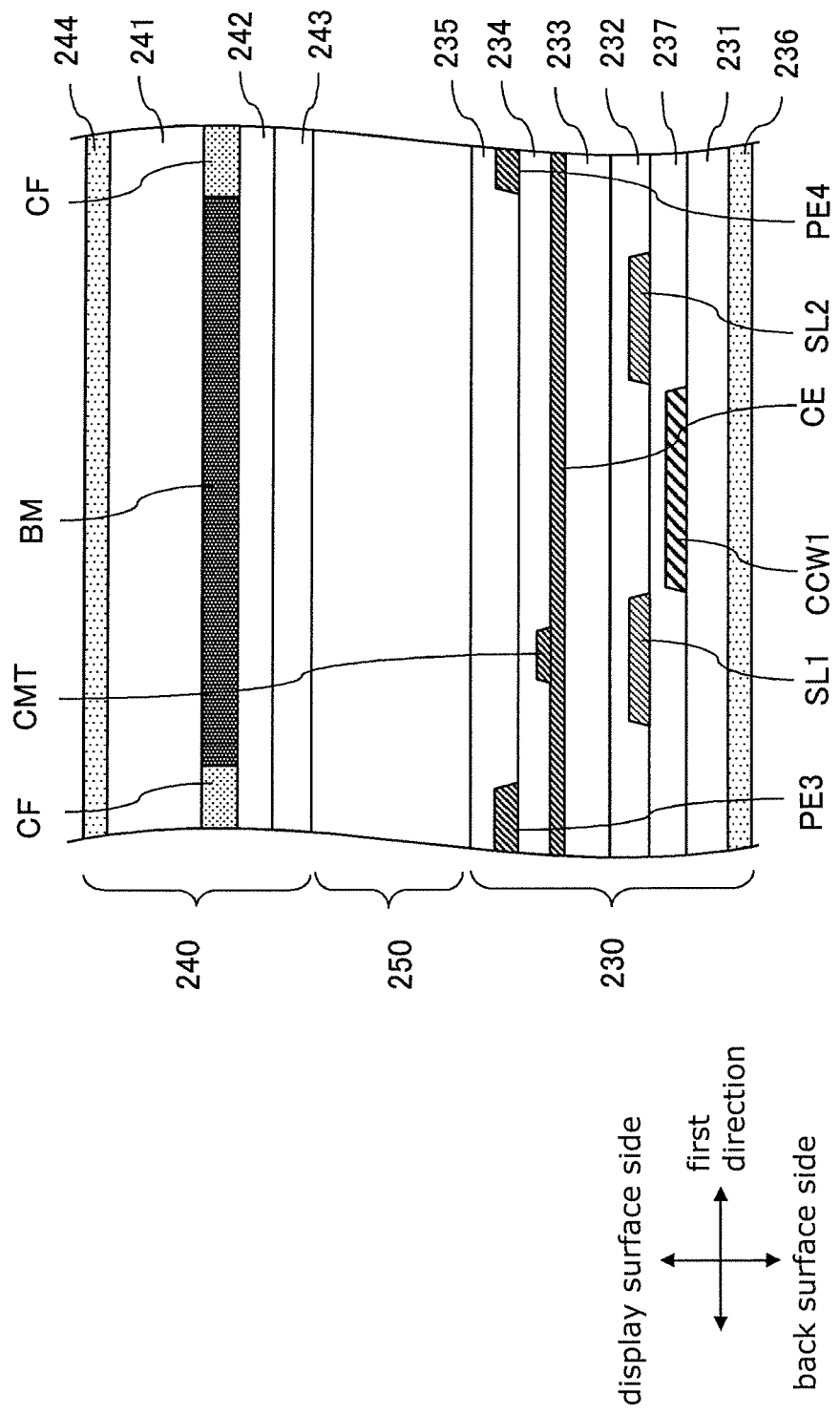
FIG. 4 is a schematic cross-sectional view illustrating a cross-section taken along line A-A' of FIG. 3.

FIG. 4 is a schematic cross-sectional view illustrating a cross-section taken along line A-A' of FIG. 3. The display panel 200 includes a thin film transistor substrate 230 that is disposed on a back surface side of the display panel 200, a counter substrate 240 that is disposed on a display surface side of the display panel 200 and that faces the thin film transistor substrate 230, and a liquid crystal layer 250 that is sandwiched between the thin film transistor substrate 230 and the counter substrate 240.

The thin film transistor substrate 230 includes a glass substrate 231, and a gate insulating film 237 formed on the display surface side of the glass substrate 231. The first cross connection wiring CCW1 is formed on the display surface side of the glass substrate 231, and the gate insulating film 237 is formed so as to cover the first cross connection wiring CCW1. The first source line SL1 and the second source line SL2 are formed on the display surface side of the gate insulating film 237, and a first insulating film 232 is formed so as to cover the first source line SL1 and the second source line SL2. Here, as described above, at least a portion of the first cross connection wirings CCW1 is overlapped between the first source line SL1 and the second source line SL2 when viewed from above.

A second insulating film 233 is formed on the display surface side of the first insulating film 232, and the common electrode CE is formed on the display surface side of the second insulating film 233. A common electrode line CMT that supplies common potential is connected to the display surface side of the common electrode CE. A third insulating film 234 is formed on the display surface side of the common electrode CE and the common electrode line CMT, and the third pixel electrode PE3 and the fourth pixel electrode PE4 are formed on the display surface side of the third insulating film 234. An alignment film 235 is formed on the display surface side of the third insulating film 234, the third pixel electrode PE3, and the fourth pixel electrode PE4. A polarizer 236 is formed on the back surface side of the glass substrate 231.

The counter substrate 240 includes the black matrix BM and a color filter CF that are formed on the glass substrate 241. Furthermore, the counter substrate 240 includes an overcoat film 242 provided so as to cover the back surface side of the black matrix BM and the color filter CF, and an alignment film 243 provided on the back surface side of the overcoat film 242. A polarizer 244 is formed on the display surface side of the glass substrate 241.

In the description given above, an example is described in which, as illustrated in FIGS. 2, 3, and 4, at least a portion of the first cross connection wirings CCW1 is overlapped between the first source line SL1 and the second source line SL2 when viewed from above. However, the present invention is not limited to this example.

Figure 5:
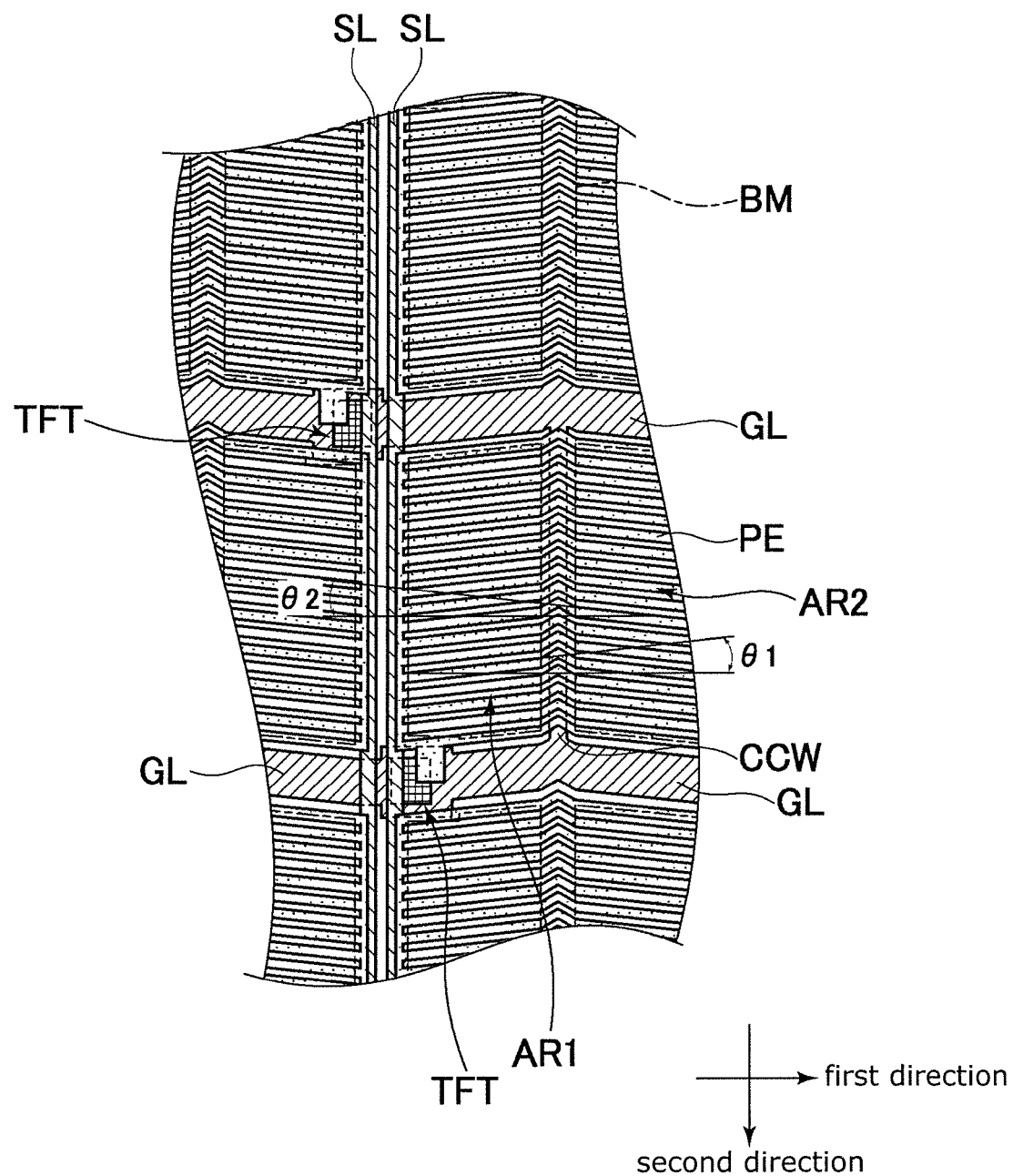
FIG. 5 is a schematic plan view illustrating the arrangement relationship between the pixel electrodes and the cross connection wiring of another example of the first exemplary embodiment.

FIG. 5 is a schematic plan view illustrating the arrangement relationship between pixel electrodes and a cross connection wiring of another example of the present embodiment. In the example illustrated in FIG. 5, two gate lines GL are disposed so as to extend in the first direction, thereby sandwiching a pixel electrode PE. Moreover, a cross connection wiring CCW that connects the two gate lines GL to each other is disposed so as to overlap with the pixel electrode PE when viewed from above.

In the example illustrated in FIG. 5, the pixel electrode PE includes a first region AR1 in that the pixel electrode PF extends at the slope of a first angle θ1 with respect to the first direction, and a second region AR2 in that the pixel electrode PF extends at the slope of a second angle θ2 different from the first angle θ1 with respect to the first direction. Additionally, the pixel electrode PE bends at the boundary between the first region AR1 and the second region AR2. Moreover, a cross connection wiring CCW overlaps with the boundary region when viewed from above.

The direction of rotation of the liquid crystal when an electric field is applied is reversed in the first region AR1 and the second region AR2. As such, the liquid crystal does not rotate at the boundary between the first region AR1 and the second region AR2 even when an electric field is applied. Therefore, the boundary region is a region that does not affect the aperture ratio of the pixel. This is preferable because, even when the cross connection wiring CCW is disposed so as to be superimposed, when viewed from above, on the boundary region that does not affect the aperture ratio, the presence of the cross connection wiring CCW does not cause a decrease of the aperture ratio.

As illustrated in FIG. 4, a distance, in a direction perpendicular to the thin film transistor substrate 230, between the cross connection wiring CCW (CCW1) and the source line SL (SL1, SL2), is shorter than a distance, in the direction perpendicular to the thin film transistor substrate 230, between the cross connection wiring CCW (CCW1) and the pixel electrode PE (PE3, PE4). As such, as illustrated in FIG. 5, the disposal position of the source line SL and the disposal position of the cross connection wiring COW are separated from each other in a direction parallel to the thin film transistor substrate 230. As a result of this configuration, it is possible to suppress the generation of parasitic capacitance between the source line SL and the cross connection wiring CCW to a greater degree than with the configuration illustrated in FIG. 3.

In the example illustrated in FIG. 5, the black matrix BM is disposed so as to be superimposed, when viewed from above, not only between two of the pixel electrodes PE that are adjacent in the first direction and between two of the pixel electrodes PE that are adjacent in the second direction, but also to be superimposed, when viewed from above, on the boundary region between the first region AR1 and the second region AR2 of the pixel electrode PE.

Figure 6:
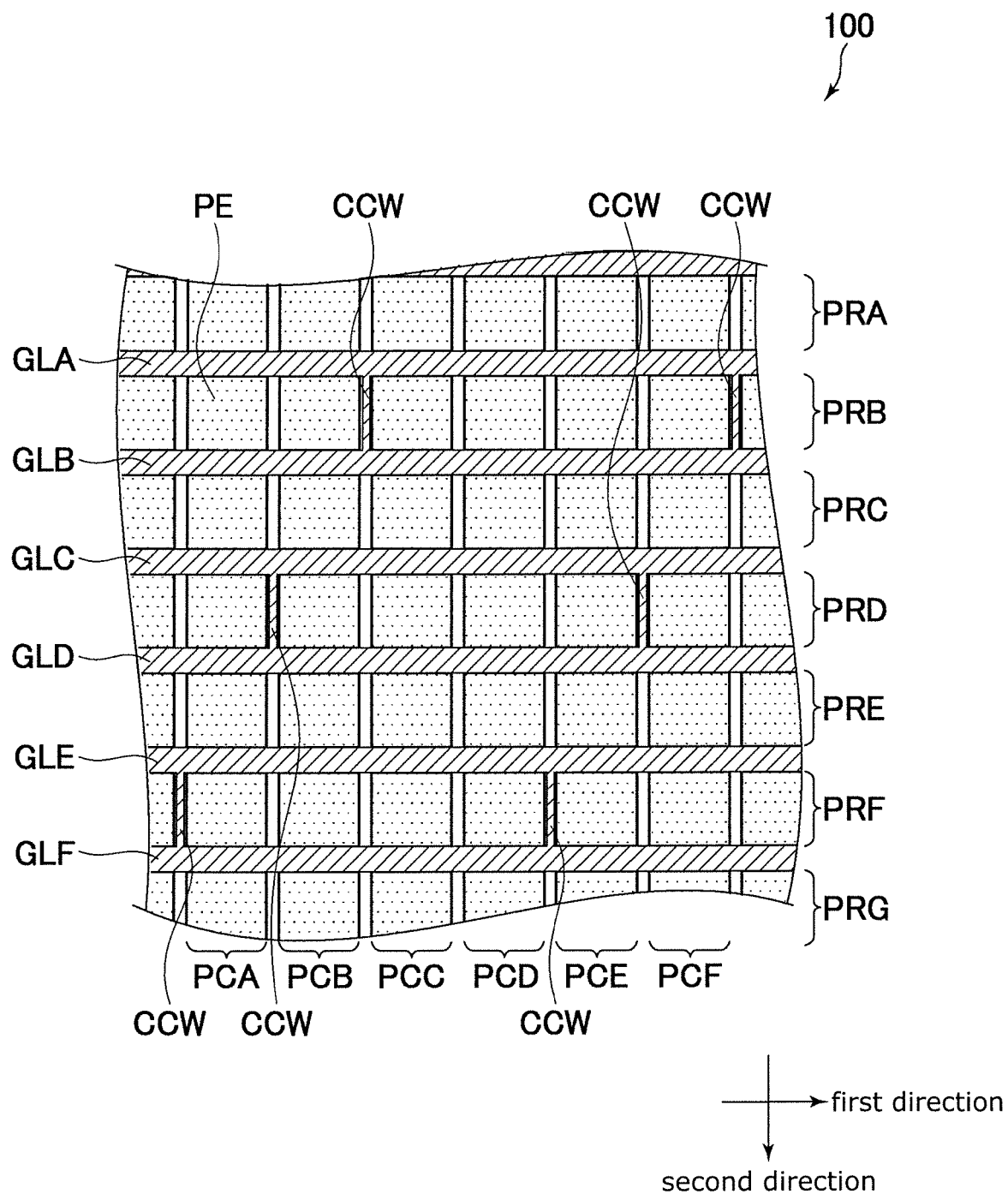
FIG. 6 is a schematic plan view illustrating the arrangement relationship between the pixel electrodes, gate lines, and the cross connection wirings according to a first exemplary embodiment.

FIG. 6 is a schematic drawing illustrating the arrangement relationship between the pixel electrodes PE, the gate lines GL, and the cross connection wirings CCW included in the display device of the present embodiment. Note that the source lines SL are not illustrated in FIG. 6.

As illustrated in FIG. 6, the display device 100 of the present embodiment includes a plurality of pixel rows PR (PRA, PRB, PRC, PRD, PRE, PRF, and PRG) that run parallel to each other in the first direction, and a plurality of gate lines GL (GLA, GLB, GLC, GLD, GLE, and GLF) that run parallel to each other in the first direction, and extend between two adjacent pixel rows PR of the plurality of pixel rows PR. Each of the pixel rows PR includes a plurality of pixel electrodes PE that are arranged in the first direction. The display device 100 further includes a plurality of cross connection wirings CCW that traverse one of the plurality of pixel rows PR and connect two gate lines GL that are adjacent in the second direction to each other.

The plurality of pixel rows PR alternately includes pixel rows PR that overlap with the plurality of cross connection wirings CCW when viewed from above and pixel rows PR that do not overlap with the plurality of cross connection wirings CCW when viewed from above. In one example, the pixel rows PRA, PRC, PRE, and PRG do not overlap with the cross connection wirings CCW when viewed from above and the pixel rows PRB, PRD, and PRF overlap with the plurality of cross connection wirings CCW when viewed from above. A common gate signal is transmitted to the gate lines GLA and GLB that are disposed so as to sandwich the pixel row PRB, a common gate signal is transmitted to the gate lines GLC and GLD that are disposed so as to sandwich the pixel row PRD, and a common gate signal is transmitted to the gate lines GLE and GLF that are disposed so as to sandwich the pixel row PRF.

Here, as illustrated in FIG. 6, it is preferable that the numbers of the cross connection wirings CCW connected to the respective gate lines GL are equal. For example, in the range illustrated in FIG. 6, the number of cross connection wirings CCW connected to the gate lines GLA and GLB, the number of cross connection wirings CCW connected to the gate lines GLC and GLD, and the number of cross connection wirings CCW connected to the gate lines GLE and GLF are respectively set to two wires. Due to this configuration, the parasitic capacitance generated in each pixel row PR and the resistance value in each pixel row PR can be aligned, and the occurrence of display inconsistencies in the display panel 200 can be suppressed.

In the example illustrated in FIG. 2, it is preferable that the number of the first cross connection wirings CCW1 that connect the first gate line GL1 and the second gate line GL2 to each other be equal to the number of the second cross connection wirings CCW2 that connect the third gate line GL3 and the fourth gate line GL4 to each other. Due to this configuration, the parasitic capacitance generated in the second pixel row PR2 and the parasitic capacitance generated in the fourth pixel row PR4 can be aligned, and the resistance value in the second pixel row PR2 and the resistance value in the fourth pixel row PR4 can be aligned. As a result, the occurrence of display inconsistencies in the display panel 200 can be suppressed.

As illustrated in FIG. 6, the display device 100 of the present embodiment includes a plurality of pixel columns PC (PCA, PCB, PCC, PCD, PCE, and PCF) that run parallel to each other in the second direction. Each of the pixel columns PC includes a plurality of pixel electrodes PE that are arranged in the second direction.

Here, as illustrated in FIG. 6, it is preferable that the numbers of cross connection wirings CCW disposed between two adjacent pixel columns PC are equal. For example, it is preferable that the number of the cross connection wirings CCW disposed between the pixel column PCA and the pixel column PCB is equal to the number of the cross connection wirings CCW disposed between the pixel column PCB and the pixel column PCC. Due to this configuration, the parasitic capacitance generated between the pixel columns PC can be aligned, and the occurrence of display inconsistencies in the display panel 200 can be suppressed.

Note that, as illustrated in FIG. 5, in a configuration in which the cross connection wirings CCW overlap with the pixel electrodes PE when viewed from above, it is preferable that the numbers of the cross connection wirings CCW that overlap with each of the pixel electrodes PE when viewed from above are equal. As a specific example, it is preferable that the number of the cross connection wirings CCW that overlap with the first pixel column PC1 when viewed from above is equal to the number of the cross connection wirings CCW that overlap with the second pixel column PC2 when viewed from above. Due to this configuration, the parasitic capacitance generated in each pixel column PC can be aligned, and the occurrence of display inconsistencies in the display panel 200 can be suppressed.

Embodiments of the present invention are described above, but the present invention should not be construed to be limited to these embodiments. It goes without saying that modifications from the embodiments described above that are appropriately implemented by a person skilled in the art and that do not depart from the spirit of the present invention are also included in the technical scope of the present invention.

What is claimed is:

1. A display device, comprising:
   a first pixel row including a first pixel electrode and a second pixel electrode that are arranged in a first direction;
   a second pixel row including a third pixel electrode and a fourth pixel electrode that are arranged in the first direction, the second pixel row being adjacent to the first pixel row in a second direction that crosses the first direction;
   a third pixel row including a fifth pixel electrode and a sixth pixel electrode that are arranged in the first direction, the third pixel row being adjacent to the second pixel row in the second direction;
   a first source line and a second source line that extend in the second direction between the first pixel electrode and the second pixel electrode, between the third pixel electrode and the fourth pixel electrode, and between the fifth pixel electrode and the sixth pixel electrode;
   a first gate line that extends in the first direction between the first pixel row and the second pixel row;
   a second gate line that extends in the first direction between the second pixel row and the third pixel row;
   a first end connection wiring that connects the first gate line to the second gate line at an end portion of the second pixel row; and
   one or more first cross connection wirings that traverse the second pixel row and connect the first gate line to the second gate line,
   wherein at least a portion of the first cross connection wirings is disposed between the first source line and the second source line in plan view.

2. The display device according to claim 1, further comprising:
   a fourth pixel row including a seventh pixel electrode and an eighth pixel electrode that are arranged in the first direction;
   a fifth pixel row including a ninth pixel electrode and a tenth pixel electrode that are arranged in the first direction;
   a third gate line that extends in the first direction between the third pixel row and the fourth pixel row;
   a fourth gate line that extends in the first direction between the fourth pixel row and the fifth pixel row;
   a second end connection wiring that connects the third gate line to the fourth gate line at an end portion of the fourth pixel row; and
   one or more second cross connection wirings that traverse the fourth pixel row and connect the third gate line to the fourth gate line; wherein
   a number of the first cross connection wirings is equal to a number of the second cross connection wirings.

3. The display device according to claim 1, further comprising:
   a plurality of pixel rows that includes the first pixel row, the second pixel row, and the third pixel row, the plurality of pixel rows running parallel to each other in the first direction,
   a plurality of gate lines that includes the first gate line and the second gate line, the plurality of gate lines running parallel to each other in the first direction and extending between two adjacent pixel rows of the plurality of pixel rows, and
   a plurality of cross connection wirings that includes the first cross connection wirings, the plurality of cross connection wiring traversing one of the plurality of pixel rows and connecting two gate lines that are adjacent in the second direction to each other.

4. The display device according to claim 3, wherein:
   the plurality of pixel rows alternately includes
   a pixel row that overlaps with the plurality of cross connection wirings in plan view, and
   a pixel row that does not overlap with the plurality of cross connection wirings in plan view.

5. The display device according to claim 3, wherein numbers of the cross connection wirings connected to each of the plurality of gate lines are equal.

6. The display device according to claim 3, further comprising:
   a first pixel column including the first pixel electrode, the third pixel electrode, and the fifth pixel electrode that are arranged in the second direction; and
   a second pixel column including the second pixel electrode, the fourth pixel electrode, and the sixth pixel electrode that are arranged in the second direction, the second pixel column being adjacent to the first pixel column in the first direction; wherein
   a number of the cross connection wirings that overlap with the first pixel column in plan view is equal to a number of the cross connection wirings that overlap with the second pixel column in plan view.

7. The display device according to claim 3, further comprising:
   a first pixel column including the first pixel electrode, the third pixel electrode, and the fifth pixel electrode that are arranged in the second direction;
   a second pixel column including the second pixel electrode, the fourth pixel electrode, and the sixth pixel electrode that are arranged in the second direction, the second pixel column being adjacent to the first pixel column in the first direction; and
   a third pixel column including a plurality of pixel electrodes that are arranged in the second direction, the third pixel column being adjacent to the second pixel column in the first direction; wherein
   a number of the cross connection wirings disposed between the first pixel column and the second pixel column is equal to a number of the cross connection wirings disposed between the second pixel column and the third pixel column.

8. The display device according to claim 1, wherein:
   the first source line is disposed at a position closer to the first pixel electrode than the second source line, and
   the second source line is disposed at a position closer to the second pixel electrode than the first source line.

9. A display device, comprising:
   a first pixel row including a first pixel electrode and a second pixel electrode that are arranged in a first direction;
   a second pixel row including a third pixel electrode and a fourth pixel electrode that are arranged in the first direction, the second pixel row being adjacent to the first pixel row in a second direction that crosses the first direction;
a third pixel row including a fifth pixel electrode and a sixth pixel electrode that are arranged in the first direction, the third pixel row being adjacent to the second pixel row in the second direction;
a first source line and a second source line that extend in the second direction between the first pixel electrode and the second pixel electrode, between the third pixel electrode and the fourth pixel electrode, and between the fifth pixel electrode and the sixth pixel electrode;
a first gate line that extends in the first direction between the first pixel row and the second pixel row;
a second gate line that extends in the first direction between the second pixel row and the third pixel row;
a first end connection wiring that connects the first gate line to the second gate line at an end portion of the second pixel row; and
one or more first cross connection wirings that traverse the second pixel row and connect the first gate line to the second gate line,
wherein the first cross connection wiring overlaps with the third pixel electrode in plan view,
wherein the third pixel electrode includes
a first region extending at a slope of a first angle with respect to the first direction, and
a second region extending at a slope of a second angle with respect to the first direction, the second angle being different from the first angle, and
wherein the first cross connection wirings overlap with a boundary between the first region and the second region in plan view.

10. A display device, comprising:
a first pixel row including a first pixel electrode and a second pixel electrode that are arranged in a first direction;
a second pixel row including a third pixel electrode and a fourth pixel electrode that are arranged in the first direction, the second pixel row being adjacent to the first pixel row in a second direction that crosses the first direction;
a third pixel row including a fifth pixel electrode and a sixth pixel electrode that are arranged in the first direction, the third pixel row being adjacent to the second pixel row in the second direction;
a first source line and a second source line that extend in the second direction between the first pixel electrode and the second pixel electrode, between the third pixel electrode and the fourth pixel electrode, and between the fifth pixel electrode and the sixth pixel electrode;
a first gate line that extends in the first direction between the first pixel row and the second pixel row;
a second gate line that extends in the first direction between the second pixel row and the third pixel row;
a first end connection wiring that connects the first gate line to the second gate line at an end portion of the second pixel row; and
one or more first cross connection wirings that traverse the second pixel row and connect the first gate line to the second gate line,
wherein the first cross connection wiring overlaps with the third pixel electrode in plan view,
wherein the display device further comprises:
a plurality of pixel rows that includes the first pixel row, the second pixel row, and the third pixel row, the plurality of pixel rows running parallel to each other in the first direction;
a plurality of gate lines that includes the first gate line and the second gate line, the plurality of gate lines running parallel to each other in the first direction and extending between two adjacent pixel rows of the plurality of pixel rows; and
a plurality of cross connection wirings that includes the first cross connection wirings, the plurality of cross connection wiring traversing one of the plurality of pixel rows and connecting two gate lines that are adjacent in the second direction to each other; and
wherein the plurality of pixel rows alternately include
a pixel row that overlaps with the plurality of cross connection wirings in plan view, and
a pixel row that does not overlap with the plurality of cross connection wirings in plan view.

11. The display device according to claim 10, wherein numbers of the cross connection wirings connected to each of the plurality of gate lines are equal.

12. The display device according to claim 10, further comprising:
a first pixel column including the first pixel electrode, the third pixel electrode, and the fifth pixel electrode that are arranged in the second direction; and
a second pixel column including the second pixel electrode, the fourth pixel electrode, and the sixth pixel electrode that are arranged in the second direction, the second pixel column being adjacent to the first pixel column in the first direction; wherein
a number of the cross connection wirings that overlap with the first pixel column in plan view is equal to a number of the cross connection wirings that overlap with the second pixel column in plan view.

13. The display device according to claim 10, further comprising:
a first pixel column including the first pixel electrode, the third pixel electrode, and the fifth pixel electrode that are arranged in the second direction;
a second pixel column including the second pixel electrode, the fourth pixel electrode, and the sixth pixel electrode that are arranged in the second direction, the second pixel column being adjacent to the first pixel column in the first direction; and
a third pixel column including a plurality of pixel electrodes that are arranged in the second direction, the third pixel column being adjacent to the second pixel column in the first direction; wherein
a number of the cross connection wirings disposed between the first pixel column and the second pixel column is equal to a number of the cross connection wirings disposed between the second pixel column and the third pixel column.

* * * * *